United States Patent [19]

Woo

[11] Patent Number: 5,422,311
[45] Date of Patent: Jun. 6, 1995

[54] METHOD FOR MANUFACTURING A CONDUCTOR LAYER IN A SEMICONDUCTOR DEVICE

[75] Inventor: Sang Ho Woo, Kyungki-Do, Rep. of Korea

[73] Assignee: Hyundai Electronics Industries Co., Ltd., Kyungki-Do, Rep. of Korea

[21] Appl. No.: 236,860

[22] Filed: May 2, 1994

[30] Foreign Application Priority Data

May 3, 1993 [KR] Rep. of Korea ............... 1993-7551
Jun. 16, 1993 [KR] Rep. of Korea ............... 1993-10939

[51] Int. Cl.⁶ .................. H01L 21/28; H01L 21/324
[52] U.S. Cl. ................................. 437/193; 437/101; 437/200; 437/967; 748/DIG. 1
[58] Field of Search ............... 437/193, 200, 191, 101, 437/967, 233; 748/DIG. 1, DIG. 147

[56] References Cited

U.S. PATENT DOCUMENTS

| | | | |
|---|---|---|---|
| 4,504,521 | 3/1985 | Widmer et al. | 427/85 |
| 4,608,118 | 8/1986 | Curtis et al. | 156/643 |
| 5,100,815 | 3/1992 | Tsubone et al. | 437/34 |
| 5,130,266 | 7/1992 | Huang et al. | 437/44 |
| 5,147,820 | 9/1992 | Chittipeddi et al. | 437/193 |
| 5,188,980 | 2/1993 | Lai | 437/193 |
| 5,278,096 | 1/1994 | Lee et al. | 437/162 |

FOREIGN PATENT DOCUMENTS

| | | | |
|---|---|---|---|
| 0173524 | 3/1986 | European Pat. Off. | 437/200 |
| 1-220846 | 9/1989 | Japan | 437/200 |
| 4-3978 | 1/1992 | Japan. | |
| 4-150018 | 5/1992 | Japan | 437/200 |

OTHER PUBLICATIONS

Yoo, C. S., et al., "Peeling-Free Tungsten Polycide...", 1991 International Symposium VLSITSA, May 1991, pp. 371-375.

Sadana, D. K., et al., "Annealing and Oxidation behavior...", J. Appl. Phys., vol. 62, No. 7, 1 Oct. 1987, pp. 2830-2835.

Shenai, K., "Structural and Electrical Properties...", IEEE Trans. Electron Devices, vol. 39, No. 1, Jan. 1992, pp. 193-199.

*Primary Examiner*—T. N. Quach
*Attorney, Agent, or Firm*—Pennie & Edmonds

[57] ABSTRACT

A method for manufacturing a conductor layer in a semiconductor device is achieved with a reduced resistivity in the conductor layer. When a polycide film comprised of a polysilicon film and a tungsten silicide film is manufactured, the grain size of the polysilicon film is increased to reduce the resistivity of the polysilicon film. Also, the silicon in the tungsten silicide film is transferred to the boundary between the tungsten silicide film and the polysilicon film to increase the adhesion properties therebetween. Accordingly, a lifting or separation phenomenon is eliminated. Furthermore, since the silicon in the tungsten silicide film is decreased by the transfer, the resistance of the conductor layer is reduced.

9 Claims, 3 Drawing Sheets

METHOD FOR MANUFACTURING A CONDUCTOR LAYER IN A SEMICONDUCTOR DEVICE

BACKGROUND

Generally, a conductor layer in a semiconductor device is formed by utilizing a polycide having a low resistivity. In order to make the polycide, a polysilicon film is formed on a silicon substrate, after which the impurity is implanted therein. Next, a tungsten silicide film having a W-Six structure is formed on the polysilicon film.

However, as semiconductor device integration is increased, the thickness of the polysilicon film must be decreased. In particular, the polysilicon film must be formed in a thickness of less than 500 Å in a semiconductor device having over 64M DRAM. However, if the thickness of the polysilicon film is formed in a thickness of less than 1000 Å, the resistivity thereof increases rapidly. As a result, while it is possible to decrease the thickness of the polysilicon film, the resistivity thereof is undesirably increased.

On the other hand, the major factors in determining the resistivity of the polysilicon film are its impurity density, thickness and the grain size of the film. Assuming that the impurity density in the polysilicon film is constant in saturation, the resistance is determined according to the thickness and the grain size of the film. That is, the thickness and the grain size of the polysilicon film are directly and closely related to each other in the following manner. The thicker the polysilicon film is, the larger the grain size will be, and conversely, the thinner the polysilicon film, the smaller the grain size. Furthermore, if the grain size of the polysilicon film is small, the density of the grain in the bulk is relatively increased and the trapping phenomenon of the carrier is extreme, thereby increasing the resistivity of the polysilicon film.

Accordingly, there is a great need to decrease the resistivity of the conductor layer to increase speed, especially when the thickness of the polysilicon film is made less than 1000 Å.

SUMMARY OF THE INVENTION

The present invention relates to a method of manufacturing a conductor layer, such as a word line or a bit line, in a semiconductor device with decreased resistance to increase speed.

Accordingly, an object of the invention is to provide a method of manufacturing a conductor layer in a semiconductor device whereby the resistance of the conductor layer is decreased to such an extent that the transfer of the data via the conductor layer can be accomplished very rapidly, for example during reading and writing data to and from a memory cell.

An another object of the present invention is to provide a method of manufacturing a conductor layer in a semiconductor device with a polysilicon film having the thickness of less than 1000 Å.

To achieve the above object and other advantages according to the present invention, an in-situ phosphorus doped amorphous silicon film is deposited on the substrate. The silicon film is then annealed to form a polysilicon film and to increase the grain size formed in the polysilicon. A tungsten silicide film is then deposited on the polysilicon film and then annealed to form a polycide film and to form a silicon layer at the boundary between the tungsten silicide film and said polysilicon film. The polycide film then can be patterned to obtain a desired pattern of a conductor layer using the photolithography method.

To achieve a thinner polysilicon film, the thickness of the polysilicon film can be etched after formation of the polysilicon film. The thickness of the silicon film is preferably 0.4–0.7 μm and that of the reduced polysilicon film is 300–1000 Å.

According to the present invention, the silicon film is deposited by a Low Pressure Chemical Vapor Deposition (LPCVD) method utilizing a $Si_2H_6$ gas, a $SiH_4$ gas or a $PH_3$ gas at a temperature of 450–550 degrees Celsius.

According to the present invention, the silicon film is annealed under inert gas environment.

According to the present invention, the silicon film is annealed at a temperature of 800–1000 degrees Celsius to increase the grain size thereof.

According to the present invention, the silicon film is annealed for approximately 5–10 hours at a temperature of about 600 degrees Celsius to increase the grain size thereof.

According to the present invention, the polysilicon film and tungsten silicide film are annealed at a temperature of 800–1000 degrees Celsius to form the silicon layer at the boundary therebetween.

BRIEF DESCRIPTION OF THE DRAWINGS

To better facilitate understanding the nature and objects of the invention, references have be made to the following description taken in conjunction with the accompanying drawings.

DESCRIPTION OF THE INVENTION

Figure 1A:
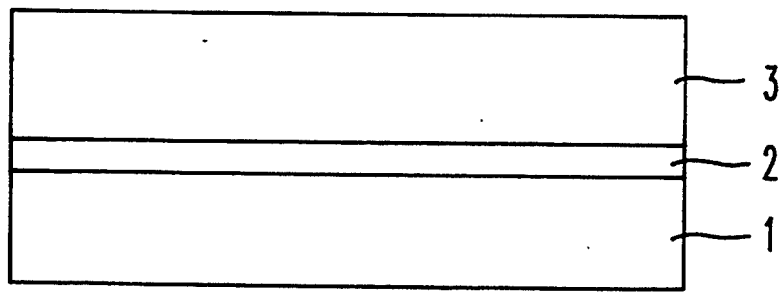
FIGS. 1A to 1E illustrate cross sectional views showing the fabrication process sequence of a method of manufacturing a conductor layer in a semiconductor device according to the present invention.

For convenience, the same or equivalent elements of the present invention illustrated in the drawings have been identified with same reference numerals.

FIGS. 1A to 1E illustrate cross sectional views showing the fabrication process sequence of a method of manufacturing a conductor layer in a semiconductor device according to the present invention.

FIG. 1A illustrates the formation of a thermal oxide film 2 formed on a silicon substrate 1 to a desired thickness. An in-situ phosphorus doped amorphous silicon film 3 is formed on the thermal oxide film 2 by a Low Pressure Chemical Vapor Deposition (LPCVD) method utilizing a $Si_2H_6$ gas, $SiH_4$ gas or $PH_3$ gas at a temperature of 450–500 degrees Celsius. The silicon film 3 is formed with a thickness of 0.4–0.7 μm greater than the desired thickness.

Figure 1B:
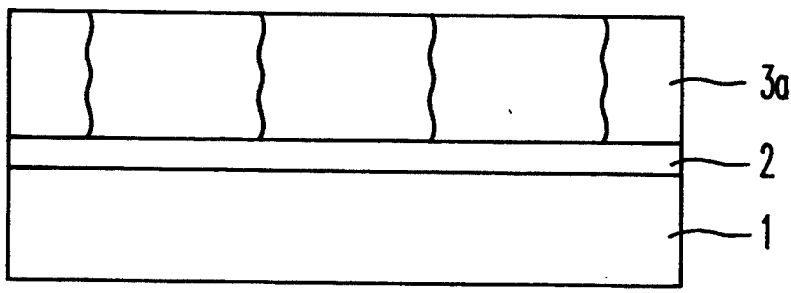

FIG. 1B illustrates the formation of the polysilicon film 3a by annealing the silicon film 3 at a temperature above 800 degree Celsius, 800–1000 degrees Celsius, and to increase the grain size thereof. As the grain size in the polysilicon film 3a is increased, the resistivity thereof is reduced.

Figure 1C:
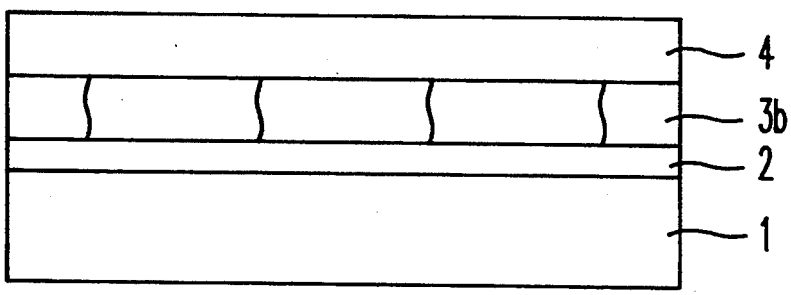

FIG. 1C illustrates the formation of a reduced polysilicon film 3b having a thickness of 300-1000 Å. The reduced polysilicon film 3b is formed by reducing the thickness of the polysilicon film 3a to a desired thickness by etching. A tungsten silicide film 4 having a W-Six structure is formed on the reduced polysilicon film 3b after impurities generated by the annealing of the polysilicon film 3a have been removed. The reduced polysilicon film 3b is thinner than that of the polysilicon film 3a while maintaining the same grain size and the same resistivity as that of the thicker polysilicon film 3a.

Figure 3:
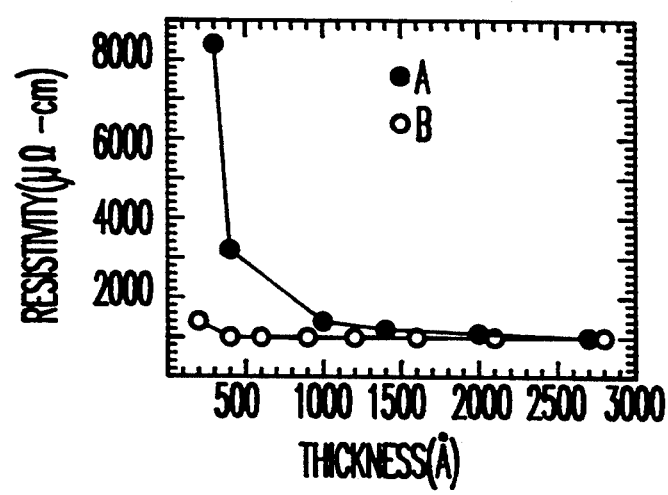
FIG. 3 illustrates a graph showing the resistivity value according to the variation of the thickness of the polysilicon film.

FIG. 3 is a graph showing the resistivity variation versus the thickness of the polysilicon film. Reference A shows the measurement value of the resistivity according to the thickness variation of the conventional polysilicon film. Reference B shows the measurement value of the resistivity according to the thickness variation of the polysilicon film formed according to the present invention, which is measured with the polysilicon film etched after the polysilicon film has been formed to thickness of 3000 Å and annealed.

As shown in FIG. 3, the polysilicon film made under the present invention has a low resistivity of 1000 $\mu\Omega$-cm for a thickness of about 400 Å and greater.

Figure 1D:
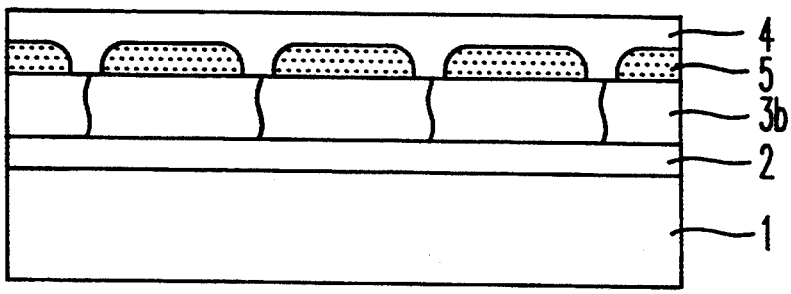

FIG. 1D illustrates the formation of a silicon layer 5 at the boundary between the tungsten silicide film 4 and the reduced polysilicon film 3b. The silicon layer 5 is formed by annealing the tungsten silicide film 4 and the reduced polysilicon film 3b at a temperature of 800-1000 degrees Celsius. The silicon in the tungsten silicide film 4 is transferred to the boundary between the tungsten silicide film 4 and the reduced polysilicon film 3b having the large grain size.

As the silicon layer 5 is formed at the boundary between the tungsten silicide film 4 and the reduced polysilicon film 3b, the adhesion between these two films is increased. Furthermore, as the silicon in the tungsten silicide film 4 is moved to the boundary, the silicon in the tungsten silicide film 4 is decreased, thereby reducing the resistivity thereof.

Figure 1E:
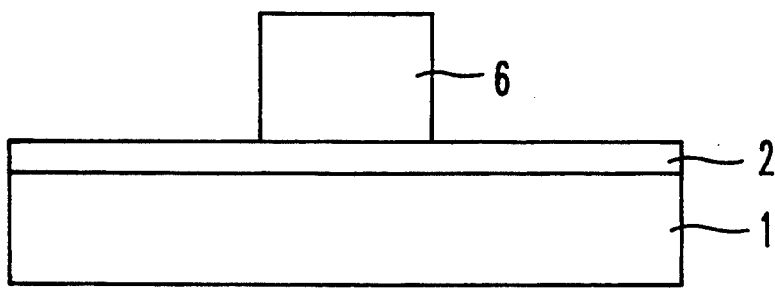

FIG. 1E illustrates the pattern of a polycide film 6 comprising the tungsten silicide film 4 and the reduced polysilicon film 3b, which has been patterned by the conventional photolithography method, for example, to form a word line or a bit line.

FIGS. 2A to 2E illustrate cross sectional views showing the fabrication process sequence of a second method of manufacturing a conductor layer in a semiconductor device according to the present invention.

Figure 2A:
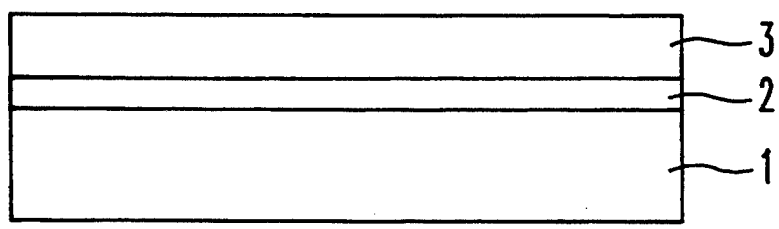
FIGS. 2A to 2E illustrate cross sectional views showing the fabrication process sequence of an alternative method of manufacturing a conductor layer in a semiconductor device according to the present invention.

FIG. 2A illustrates the formation of a thermal oxide film 2 on a silicon substrate 1 to a desired thickness and the subsequent formation of an in-situ phosphorus doped amorphous silicon film 3 on the thermal oxide film 2 by the LPCVD method utilizing a $Si_2H_6$ gas or a $PH_3$ gas at a low temperature of 450-500 degrees Celsius.

Figure 2B:
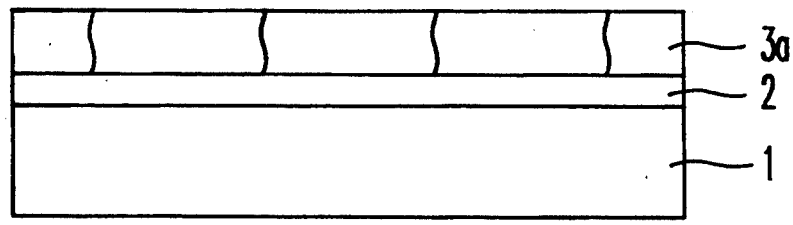

FIG. 2B illustrates the formation of a polysilicon film 3a by annealing the silicon film 3a at a low temperature of about 600 degrees Celsius under inert gas environment during a prolonged period, for example for approximately 5-10 hours, and to increase the grain size thereof. As the grain size in the polysilicon film 3a increases, the resistivity thereof diminishes.

Figure 2C:
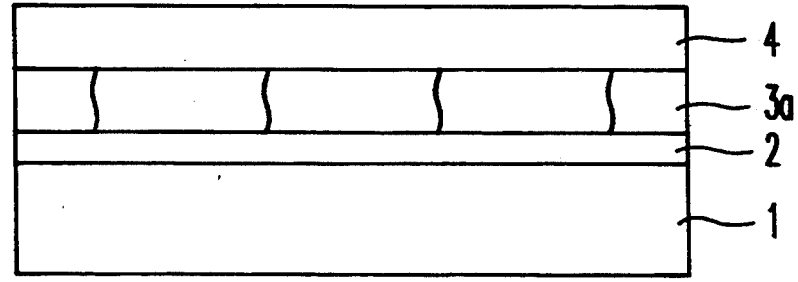

FIG. 2C illustrates the formation of a tungsten silicide film 4 on the polysilicon film 3a after impurities, generated by the annealing of the polysilicon film 3a at a low temperature during a long period of time in a solid state, have been removed.

Figure 2D:
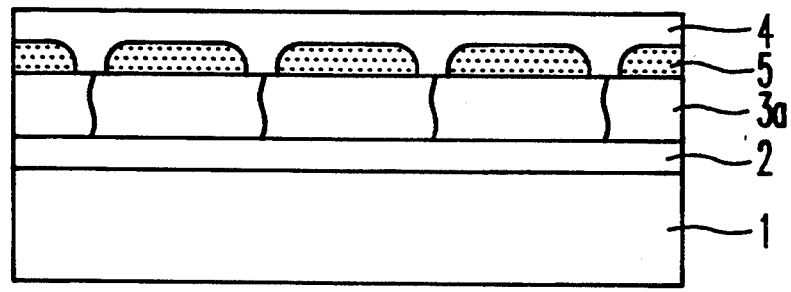

FIG. 2D illustrates the formation of a silicon layer 5 at the boundary between the tungsten silicide film 4 and the polysilicon film 3a by annealing the tungsten silicide film 4 and the polysilicon 3a at a temperature of 800-1000 degrees Celsius. The silicon in the tungsten silicide film 4 is transferred to the boundary between the tungsten silicide film 4 and the polysilicon film 3a having the large grain size.

As the silicon layer 5 is formed at the boundary between the tungsten silicide film 4 and the polysilicon film 3a the adhesion between these two films is increased. Furthermore, as the silicon in the tungsten silicide film 4 is moved to the boundary, the silicon in the tungsten silicide film 4 is decreased, thereby reducing the resistivity thereof.

Figure 2E:
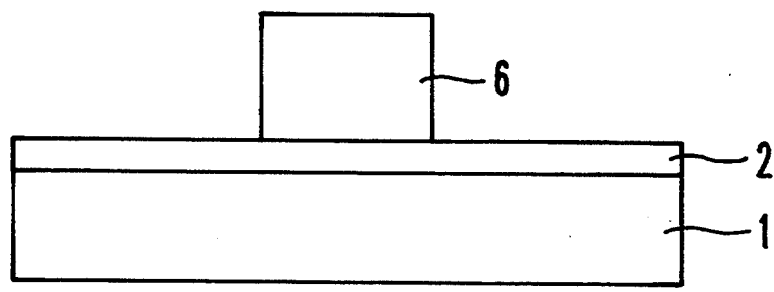

FIG. 2E illustrates the pattern of a polycide film 6 comprised of the tungsten silicide film 4 and the polysilicon film 3a of FIG. 2C, which has been patterned by the conventional photolithography method, for example to form a word line or a bit line.

As described above, as a result of the present invention, the grain size of the polysilicon film is enlarged, thereby reducing the film's resistivity. Furthermore, as the silicon in the tungsten silicide film is transferred to the boundary between the tungsten silicide film and the polysilicon film, adhesion between these two films is increased, thereby preventing the lifting phenomenon. Moreover, as the silicon existing in the tungsten silicide is reduced the resistance of a conductor layer is thereby reduced.

The foregoing description, although described in its preferred embodiment with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A method for manufacturing a conductor layer in a semiconductor device comprising the steps of:
   a) depositing an in-situ phosphorus doped amorphous silicon film on a substrate;
   b) annealing said silicon film to form a polysilicon film and to increase the size of the grain formed in said polysilicon;
   c) depositing a tungsten silicide film on said polysilicon film and then annealing said tungsten silicide film to form a polycide film and to form a silicon layer at the boundary between said tungsten silicide film and said polysilicon film; and
   d) patterning said polycide film to obtain the desired pattern of said conductor layer using a photolithography method.

2. A method for manufacturing a conductor layer in a semiconductor device according to claim 1, wherein said silicon film is annealed under inert gas environment.

3. A method for manufacturing a conductor layer in a semiconductor device according to claim 2, wherein said silicon film is deposited by the LPCVD method utilizing a $Si_2H_6$ gas or a $PH_3$ gas at a temperature of 450-550 degrees Celsius.

4. A method for manufacturing a conductor layer in a semiconductor device according to claim 2, wherein said silicon film is annealed for approximately 5–10 hours at a temperature of about 600 degrees Celsius to increase the grain size thereof.

5. A method for manufacturing a conductor layer in a semiconductor device according to claim 2, wherein said polysilicon film and tungsten silicide film are annealed at a temperature of 800–1000 degrees Celsius to form said silicon layer at the boundary therebetween.

6. A method for manufacturing a conductor layer in a semiconductor device comprising the steps of:
   a) depositing an in-situ phosphorus doped amorphous silicon film on a substrate;
   b) annealing said silicon film to form a polysilicon film and to increase the size of the grain formed in said polysilicon;
   c) reducing the thickness of said polysilicon film by etching said first polysilicon film to form a reduced polysilicon film;
   d) depositing a tungsten silicide film on said reduced polysilicon film and then annealing said tungsten silicide film to form a polycide film and to form a silicon layer at the boundary between said tungsten silicide film and said reduced polysilicon film; and
   e) patterning said polycide film to obtain a desired pattern of said conductor layer using a photolithography method.

7. A method for manufacturing a conductor layer in a semiconductor device according to claim 6, wherein the thickness of said silicon film is 0.4–0.7 $\mu$m and that of said reduced polysilicon film is 300–1000 Å.

8. A method for manufacturing a conductor layer in a semiconductor device according to claim 6, wherein said silicon film is deposited by the LPCVD method utilizing a $Si_2H_6$ gas, a $SiH_4$ gas or a $PH_3$ gas at a temperature of 450–550 degrees Celsius.

9. A method for manufacturing a conductor layer in a semiconductor device according to claim 6, wherein said silicon film is annealed at a temperature of 800–1000 degrees Celsius to increase the grain size thereof.

* * * * *